METHOD AND ARTICLE FOR MAKING SWITCHABLE SEMICONDUCTOR ELEMENTS

Filed Sept. 21, 1966

INVENTOR
Edgar Lutz

BY Spencer & Kaye
ATTORNEYS

INVENTOR
Edgar Lutz

BY Spencer & Kaye
ATTORNEYS

United States Patent Office 3,435,305
Patented Mar. 25, 1969

3,435,305

METHOD AND ARTICLE FOR MAKING SWITCHABLE SEMICONDUCTOR ELEMENTS

Edgar Lutz, Pliezhausen, Germany, assignor to Semikron Gesellschaft fur Gleichrichterbau und Elektronik m.b.H., Nuremberg, Germany Filed Sept. 21, 1966, Ser. No. 581,034
Claims priority, application Germany, Sept. 21, 1965, S 99,549
Int. Cl. H01l 7/00, 9/00
U.S. Cl. 317—235 11 Claims

ABSTRACT OF THE DISCLOSURE

A method for making a plurality of switchable semiconductor elements from a single wafer of semiconductor material having a p-n-p series of layers and an article which is produced at an intermediate step of the method. The method includes the steps of contacting one side of the semiconductor wafer with a $p^+$-doped metal foil, contacting the metal foil with a first contact plate, contacting the other side of the semiconductor wafer with a second contact plate having a plurality of grooves filled with cathode material, slicing the second contact plate along lines defined by one edge of the grooves to separate cathode zones from control electrode zones and slicing the semiconductor packet so formed along lines defined by the other edge of the grooves to divide the packet into the plurality of switchable semiconductor elements.

The present invention relates generally to a semiconductor element and a method for its production, and, more particularly, to a semiconductor element having three or more layers with alternating conductivity and a simplified method for producing such semiconductor elements.

Semiconductor elements can be used as simple rectifiers, as controllable semiconductor elements such as thyristors and as multilayer switching elements. Many years of development have produced large surface semiconductor elements having not only a correspondingly large current carrying capacity but also a high blocking voltage capacity. Power current techniques have stimulated the development of improved large surface semiconductor elements.

However, to produce small surface semiconductor elements, additional production difficulties are encountered. The methods which are satisfactory for large surface elements are not economical enough for the small surface elements. Accordingly, new economical methods for the production of small semiconductor elements are necessary.

It goes without saying that the small surface semiconductor elements must be just as stable in their electrical and physical properties as the large surface semiconductor elements. They must meet the current loading and blocking voltage requirements. Moreover, they mnst be able to withstand externally applied mechanical and thermal stresses, particularly, when, during the manufacturing process, the electrical contacts are joined to the semiconductor elements.

Semiconductor elements which are produced by a combination of diffusion and alloying techniques exhibit desirable current loading properties and also high resistive capacity. These properties are desirable not only for large surface, but also for small surface semiconductor elements.

According to the previously known methods, a semiconductor wafer having n-type conductivity is provided as the starting material and subjected to a diffusion process. The n-type material is thus surrounded with a layer having p-type conductivity, i.e., it is enclosed in a p-n junction. The enclosing p-n junction can be separated into two parallel p-n junctions by cutting away the edge portions. On one of the two surfaces of the p-n-p structure an n-conductivity layer is alloyed or diffused to form a cathode. The other surface portion of the semiconductor wafer, which forms the anode, is provided with a contact.

In controllable semiconductor rectifiers such as silicon controlled rectifiers, the cathode layer is applied with recesses in the region of the control electrode zone. These recesses must be made during the diffusion process by masking or, if alloying methods are used, by covering, etching, etc. These techniques require substantial time and expense.

These known methods and the difficulties associated therewith are overcome by the semiconductor element incorporating the principles of the present invention and by the method for producing this element. The large surface semiconductor elements that can be produced with the method of the present invention, and the many small surface semiconductor elements which can be produced, in accordance with the invention, out of large surface semiconductor elements satisfy all of the technical requirements for semiconductor elements of this type.

Accordingly, it is an object of the present invention to provide a new and improved semiconductor element.

A second object of the present invention is to provide a new and improved method for producing a semiconductor element.

A further object of the present invention is to provide a semiconductor element fulfilling all of the technical requirements of large surface semiconductor elements but which may be constructed in the form of small surface semiconductor elements.

A further object of the present invention is to provide a new and improved method for producing a semiconductor element which is substantially less expensive than known methods.

With the above objects in mind, the present invention includes a semiconductor element which includes a semiconductor wafer having a p-n-p structure which is provided at its anode side with a contacting layer and at its cathode side with a contacting layer having depressions such as grooves containing cathode n-conductive material. A layered package is thus provided whereby, by cutting into each second edge of the cathode strips, the control electrodes and the cathode strips can be separated from one another.

In addition, the present invention includes a method for producing a semiconductor element which starts with a semiconductor wafer having a p-n-p structure a p-doped foil, for example an aluminum, gold-boron or gold-gallium foil, which may contact a contact wafer made, for example, of tungsten, molybdenum or other suitable material is applied to the anode side of the semiconductor wafer along with an aluminum wafer. A contact wafer is provided at the cathode side of the semiconductor wafer having selected surface portions of a particular width and depth which contain suitably doped (e.g. $p^+$-doped) cathode material. This wafer package is then put together by means of an alloying process and finally cut in a particular way.

Additional objects and advantages of the present invention will become more apparent upon consideration of the following description when taken in conjunction with the accompanying drawings in which.

Figure 1:
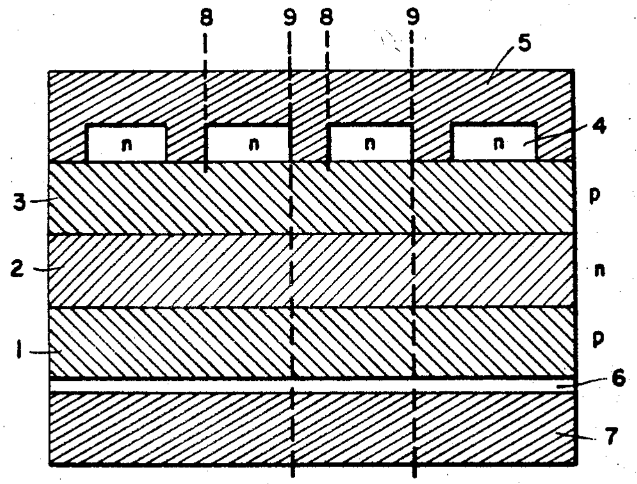
FIGURE 1 is a transverse sectional view of a semiconductor element incorporating the principles of the present invention.

Referring to the drawings and, more particularly, to FIGURE 1, the construction of a large surface semiconductor element produced by a combination diffusion and alloying process is illustrated having a segmented cathode 4. The starting structure is the n-type semiconductive wafer 2 into both major surfaces of which p-type impurities have been diffused to form the p-n-p structure represented by the layers 1, 2 and 3.

On the anode side 1 of the semiconductor wafer is an aluminum foil 6 which is contacted, if necessary by a contact wafer 7. The contact wafer 7 can, for example, be made from molybdenum, tungsten or other suitable material which will provide a good contacting surface.

On the other p-type semiconductor layer 3 is arranged a strip shaped cathode layer 4 having n-type conductivity. Also arranged on the semiconductor layer 3 is a contact layer 5. All of these layers can be combined into a single semiconductor package in a single alloying step. At the same time, contacts for the anode and the cathode can be made so that a mechanical structure results which can withstand the temperature and mechanical stresses and strains to which it is subjected during further processing techniques when it is made into a finished semiconductor device.

If the boundary lines of the cathode strips 4, indicated by the dotted lines 8 and 9 are used as cutting guides and they are cut in an alternate manner so that the lines 8 are cut only down to the control electrode zone 3 while the lines 9 are cut all the way through, the result will be a strip shaped semiconductor element having four layers of alternating types of conductivity. Also, the cutting operation will serve the purpose of separating the control electrode 3 from the cathode 4.

The strip shaped control electrode surfaces 3 of the sliced package would run parallel to a strip shaped cathode 4 and cathode contacting surface 5 and on the other side would be an anode contact surface 7. For further processing into a finished semiconductor device this arrangement permits all of the electrodes of the semiconductor element to be readily available for contacting purposes.

If desired, the cathode layer 4 can advantageously be melted or fused onto the contact layer 5 before the alloying process takes place.

Figure 2:
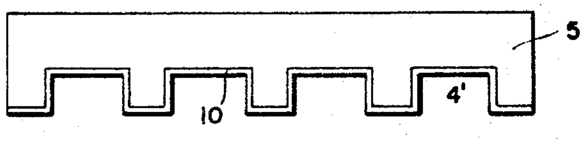
FIGURE 2 is a front view of a contact wafer that may be used which incorporates the principles of the present invention.

Referring now to FIGURE 2, an illustration is shown of the channels 4', for producing the strip shaped cathode segments in the contact plate 5. The contact plate 5 will function as contact material for the cathode and also for the control electrode. For example, a contact plate 5 can be used in which flat or deep furrows, grooves or channels have been formed with great precision. These grooves or channels have a preselected thickness, width and length so as to produce a desired form which can serve after primary treatment as a contact plate.

The grooves can be coated with a material, such as gold, silver, platinum or copper, which will provide good contact with the contact plate 5 and then filled with a material having n-type conductivity. Such filling can be accomplished by compression, casting, evaporation or filling techniques. This treated contact plate filled with the cathode material can be applied to the semiconductive wafer by a common alloying process. In this way, not only is the alloying simplified but the entire manufacturing process is simplified while the exact shape of the alloyed strips is assured.

As mentioned above, the contact layer 5 can, if necessary, be provided with a coating 10 on the side having the channels 4' before the cathode material is introduced into these channels. For example, such coating 10 may be a material which alloys with silicon. In special cases when the contact wafer 5 is made from a material which is alloyed with silicon, the coating 10 with the alloy conductive contact material can be confined to the outer surfaces of the channels 4'. In this way many of the difficulties in achieving precise alloyed shapes for multicomponent semiconductors, can be avoided.

Figure 3:
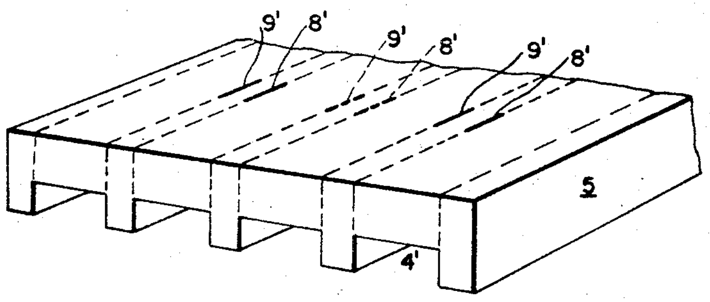
FIGURE 3 is a perspective plan view of the contact wafer of the present invention shown in FIGURE 2.

Referring now to FIGURE 3, the contact plate having the channels 4' is shown in perspective plan view. The markings 8' and 9' on the contact plate 5 correspond with the edges of the channels 4' on the other side thereof. By means of these markings, production of the contact plate and the grid in the finished package is greatly simplified since, by these lines, the holding points and the contact or contact lines for the lattice laminations are provided.

The alloyed semiconductor packet shown in FIGURE 1 may be sliced in alternating series fashion along the edges of the n-type conductivity strips 4 which can, for example, be made from doped gold. That is, the packet is first sliced along the line 8 only as far as the control electrode 3. Then the packet is cut all the way through along the line 9. Thus a strip shaped semiconductor element with control electrode, cathode and anode is provided. By making a series of orthogonal cuts, it is then possible to produce a series of thyristors having small surface dimensions. That is, a series of cuts perpendicular to each other will produce such thyristors.

Figure 4:
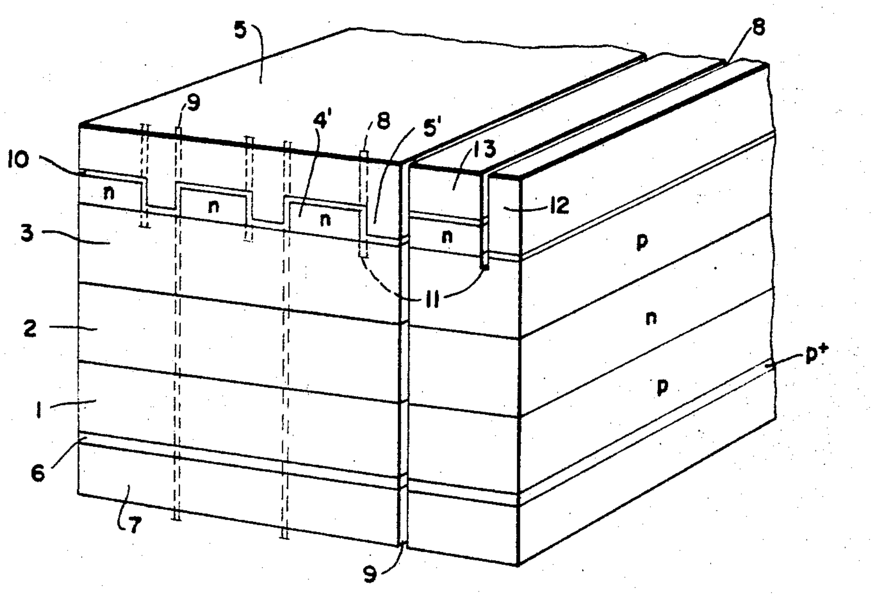
FIGURE 4 is a perspective plan view of an entire semiconductor embodiment.
Figure 5:
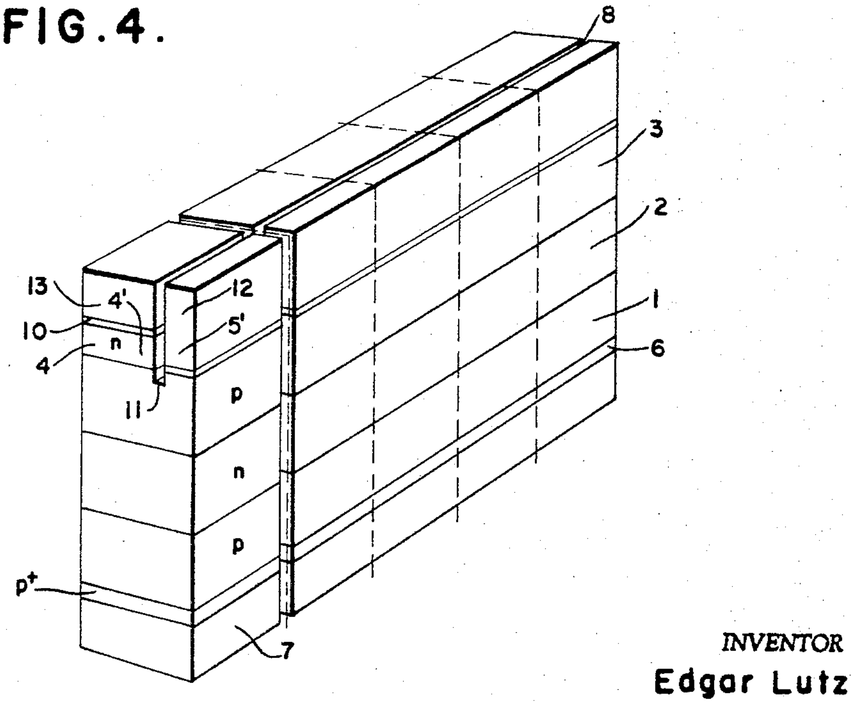
FIGURE 5 is a perspective plan view of a separated complete semiconductor element according to the present invention.

FIGURE 4 is a perspective plan view of an entire semiconductor embodiment which is produced in accordance with the invention. FIGURE 5 shows a perspective plan view of a separated complete semiconductor element. The starting material is a n-type silicon wafer. A p-n-p structure 1, 2, 3 is obtained by a well-known diffusion process, and aluminum foil 6 of $p^+$ type material and a contact wafer 7 arranged on the anode side. This contact wafer 7 can be made, for example from tungsten, molybdenum or other suitable material. A contact plate 5 is next prepared with preselected channels or grooves 4'. The extended portions 5' and the channels 4' are coated with a contacting material 10 and the channels filled with n-type cathode material 4. The contact plate 5, and with it the strip shaped cathode layer, is then arranged on the other p-type layer 3 of the p-n-p-type semiconductor wafer. On the opposite side of channels the contact plate exhibits markings 8 and 9 which correspond with the edges of the channels 4'. The alloyed semiconductor element may finally be sliced along the edges of the cathode strips 4 in alternating series fashion. Along the line 8 the element is sliced only to the point 11, so that the contact 12 to the control electrode is electrically separated from the cathode strip 4 and from the contact 13 to the cathode strip. The slice all the way along the line 9 separates a complete semiconductor element shown in FIGURE 5. This complete semiconductor element can be divided, if desired, into two or more smaller devices by making series of orthogonal cuts, as shown.

It will be understood that the above description of the present invention is susceptible to various modifications, changes and adaptations, and the same are intended to be comprehended within the meaning and range of equivalents of the appended claims.

What is claimed is:

1. A semiconductor element comprising, in combination:

(a) a wafer of semiconductor material having three layers, the center layer of which has a first conductivity and the two adjacent outer layers of which have a second conductivity opposite to said first conductivity, one of said outer layers forming a base for an anode and the other of said outer layers forming a base for a cathode and a control electrode, insulated from the cathode;

(b) a metal foil, having said second conductivity, contacting said one outer layer;

(c) a first metal contact plate contacting said metal foil, said first contact plate forming an anode terminal;

(d) a second metal contact plate contacting said other outer layer, said second contact plate having a plurality of strip-shaped channels, on the side thereof in contact with said outer layer, which contain cathode material having said first conductivity, said cathode material forming strip-shaped cathode zones on said other outer layer, whereby the layer structure forms a packet which can be divided into a plurality of switchable semiconductor elements by slicing said second contact plate to separate cathode zones from control electrode zones and slicing said packet.

2. The semiconductor element defined in claim 1, wherein said strip-shaped channels in said second contact plate are arranged in parallel and have a prescribed width and depth.

3. The semiconductor element defined in claim 1, wherein said wafer of semiconductive material is made of silicon and said center layer has an n-type conductivity.

4. The semiconductor element defined in claim 1, wherein said first and said second contact plates are made from a material selected from the group consisting of tungsten and molybdenum.

5. The semiconductor element defined in claim 1, wherein said metal foil is a $p^+$-doped foil of a material selected from the group consisting of aluminum, gold-boron and gold-gallium.

6. The semiconductor element defined in claim 1, wherein said second contact plate has a plurality of markings on the side thereof opposite to the side in contact with said other outer layer, said markings being indicative of the places where said second contact plate and said packet are to be sliced.

7. The semiconductor element defined in claim 4, further comprising an aluminum wafer contacting said first metal contact plate.

8. A method of producing a plurality of switchable semiconductor elements from a wafer of semiconductor material having a p-n-p series of layers, comprising the steps of:

(a) contacting one of said p-doped layers of said wafer with a $p^+$-doped metal foil;

(b) contacting said metal foil with a first contact plate, said first contact plate forming an anode terminal;

(c) contacting the other of said p-doped layers of said wafer with a second metal contact plate having a plurality of strip-shaped channels, on the side thereof in contact with said other layer, which contain cathode material, in a single alloying step;

(d) slicing said second contact plate along lines defined by one edge of said channels to separate cathode zones from control electrode zones; and (e) slicing the semiconductor packet so formed along lines defined by the other edge of said channels to divide said packet into a plurality of strip-shaped switchable semiconductor elements.

9. The method defined in claim 8, wherein said strip-shaped channels in said second contact plate are arranged in parallel.

10. The method defined in claim 9, wherein said slicing steps (d) and (e) are carried out in a single step by a plurality of parallel saw blades and wherein said contact plate is sliced along the line defined by said one edge to a depth of said other p-doped layer.

11. The method defined in claim 8, further comprising the step of slicing said strip-shaped switchable semiconductor elements in a direction orthogonal to the direction in which said semiconductor packet is sliced in step (e), thereby to produce a plurality of small surfaced switchable semiconductor elements.

References Cited

UNITED STATES PATENTS

| | | | |
|---|---|---|---|
| 3,356,862 | 12/1967 | Diebold | 307—885 |
| 3,268,782 | 8/1966 | Weinstein | 317—235 |

JOHN W. HUCKERT, *Primary Examiner.*

M. EDLOW, *Assistant Examiner.*

U.S. Cl. X.R.

29—578, 580; 317—234